United States Patent
Thompson et al.

(10) Patent No.: US 9,308,680 B2
(45) Date of Patent: Apr. 12, 2016

(54) LIGHT EMITTING DEVICE WITH MULTILAYER SILICON-CONTAINING ENCAPSULANT

(75) Inventors: D. Scott Thompson, Woodbury, MN (US); Larry D. Boardman, Woodbury, MN (US); Catherine A. Leatherdale, Woodbury, MN (US)

(73) Assignee: 3M INNOVATIVE PROPERTIES COMPANY, Saint Paul, MN (US)

( * ) Notice: Subject to any disclaimer, the term of this patent is extended or adjusted under 35 U.S.C. 154(b) by 1083 days.

(21) Appl. No.: 12/698,251

(22) Filed: Feb. 2, 2010

(65) Prior Publication Data
US 2010/0133574 A1 Jun. 3, 2010

Related U.S. Application Data

(63) Continuation of application No. 11/741,808, filed on Apr. 30, 2007, now Pat. No. 7,655,486.

(51) Int. Cl.
H01L 27/15 (2006.01)
B29C 45/16 (2006.01)
(Continued)

(52) U.S. Cl.
CPC ............ *B29C 45/1671* (2013.01); *C08L 83/04* (2013.01); *B29C 45/14655* (2013.01); *B29C 2035/0833* (2013.01); *B29K 2083/00* (2013.01); *C08G 77/12* (2013.01); *C08G 77/20* (2013.01); *C08G 77/70* (2013.01); *C08G 77/80* (2013.01); *C08L 2312/06* (2013.01); *H01L 33/56* (2013.01); *H01L 2224/45144* (2013.01); *H01L 2224/48091* (2013.01); *H01L 2224/48247* (2013.01)

(58) Field of Classification Search
CPC ........... H01L 2224/45144; H01L 2224/48091; H01L 2924/00; H01L 2924/00014; H01L 2224/48247; H01L 33/56
USPC .................................... 257/79–100, E25.032
See application file for complete search history.

(56) References Cited

U.S. PATENT DOCUMENTS 2,823,218 A 2/1958 Speier et al.
3,159,662 A 12/1964 Ashby
(Continued)

FOREIGN PATENT DOCUMENTS

EP 398 573 11/1990
EP 1 198 016 4/2002
(Continued)

OTHER PUBLICATIONS

"Silicones," Encyclopedia of Polymer Science and Technology, vol. 11, pp. 765-841, Apr. 2003.

*Primary Examiner* — H Tsai (57) ABSTRACT

A light emitting device that includes a light emitting diode and a multilayer encapsulant is disclosed. The multilayer encapsulant includes a first encapsulant in contact with the light emitting diode and a photopolymerizable composition in contact with the first encapsulant. The first encapsulant may be a silicone gel, silicone gum, silicone fluid, organosiloxane, polysiloxane, polyimide, polyphosphazene, sol-gel composition, or another photopolymerizable composition. The photopolymerizable compositions include a silicon-containing resin and a metal-containing catalyst, the silicon-containing resin comprising silicon-bonded hydrogen and aliphatic unsaturation. Actinic radiation having a wavelength of 700 nm or less can be applied to initiate hydrosilylation within the silicon-containing resins.

13 Claims, 1 Drawing Sheet

(51) Int. Cl.

| | |
|---|---|
| *C08L 83/04* | (2006.01) |
| *B29C 45/14* | (2006.01) |
| *B29C 35/08* | (2006.01) |
| *B29K 83/00* | (2006.01) |
| *C08G 77/12* | (2006.01) |
| *C08G 77/20* | (2006.01) |
| *C08G 77/00* | (2006.01) |
| *H01L 33/56* | (2010.01) |

(56) References Cited

U.S. PATENT DOCUMENTS

| | | | |
|---|---|---|---|
| 3,220,972 | A | 11/1965 | Lamoreaux |
| 3,410,886 | A | 11/1968 | Joy |
| 3,419,593 | A | 12/1968 | Willing |
| 3,445,420 | A | 5/1969 | Kookootsedes et al. |
| 3,715,334 | A | 2/1973 | Karstedt |
| 3,814,730 | A | 6/1974 | Karstedt |
| 3,933,880 | A | 1/1976 | Bergstrom et al. |
| 3,989,666 | A | 11/1976 | Niemi |
| 3,989,667 | A | 11/1976 | Lee et al. |
| 4,256,870 | A | 3/1981 | Eckberg |
| 4,347,346 | A | 8/1982 | Eckberg |
| 4,421,903 | A | 12/1983 | Ashby |
| 4,435,259 | A | 3/1984 | Chang |
| 4,501,637 | A | 2/1985 | Mitchell et al. |
| 4,504,645 | A | 3/1985 | Melancon |
| 4,510,094 | A | 4/1985 | Drahnak |
| 4,530,879 | A | 7/1985 | Drahnak |
| 4,585,669 | A | 4/1986 | Eckberg |
| 4,587,137 | A | 5/1986 | Eckberg |
| 4,600,484 | A | 7/1986 | Drahnak |
| 4,603,215 | A | 7/1986 | Chandra et al. |
| 4,609,574 | A | 9/1986 | Keryk et al. |
| 4,647,331 | A | 3/1987 | Koury et al. |
| 4,670,531 | A | 6/1987 | Eckberg |
| 4,705,765 | A | 11/1987 | Lewis |
| 4,774,111 | A | 9/1988 | Lo |
| 4,916,169 | A | 4/1990 | Boardman et al. |
| RE33,289 | E | 8/1990 | Modic |
| 5,063,102 | A | 11/1991 | Lee et al. |
| 5,122,943 | A | 6/1992 | Pugh |
| 5,145,886 | A | 9/1992 | Oxman et al. |
| 5,213,864 | A | 5/1993 | Wong |
| 5,310,581 | A | 5/1994 | Schmidt et al. |
| 5,313,365 | A | 5/1994 | Pennisi et al. |
| 5,403,773 | A | 4/1995 | Nitta et al. |
| 5,496,961 | A | 3/1996 | Dauth et al. |
| 5,523,436 | A | 6/1996 | Dauth et al. |
| 5,525,564 | A | 6/1996 | McAfee et al. |
| 5,639,845 | A | 6/1997 | Inomata et al. |
| 5,750,641 | A | 5/1998 | Ezzell et al. |
| 5,777,433 | A | 7/1998 | Lester et al. |
| 5,895,228 | A | 4/1999 | Biebuyck et al. |
| 5,952,397 | A | 9/1999 | Fujiki et al. |
| 5,959,316 | A | 9/1999 | Lowery |
| 6,046,250 | A | 4/2000 | Boardman et al. |
| 6,099,783 | A | 8/2000 | Scranton et al. |
| 6,114,090 | A | 9/2000 | Wu et al. |
| 6,150,546 | A | 11/2000 | Butts |
| 6,204,523 | B1 | 3/2001 | Carey et al. |
| 6,274,890 | B1 | 8/2001 | Oshio et al. |
| 6,274,924 | B1 | 8/2001 | Carey et al. |
| 6,319,425 | B1 | 11/2001 | Tasaki et al. |
| 6,376,569 | B1 | 4/2002 | Oxman et al. |
| 6,451,869 | B1 | 9/2002 | Butts |
| 6,521,916 | B2 | 2/2003 | Roberts et al. |
| 6,576,488 | B2 | 6/2003 | Collins, III et al. |
| 6,600,175 | B1 | 7/2003 | Baretz et al. |
| 6,653,157 | B2 | 11/2003 | Kondo |
| 6,664,318 | B1 | 12/2003 | Bymark et al. |
| 6,717,362 | B1 | 4/2004 | Lee et al. |
| 6,740,465 | B2 | 5/2004 | Liang et al. |
| 6,756,731 | B1 | 6/2004 | Sano |
| 6,806,509 | B2 | 10/2004 | Yoshino et al. |
| 6,806,658 | B2 | 10/2004 | Tan et al. |
| 6,869,813 | B2 | 3/2005 | Okazaki |
| 6,888,174 | B2 | 5/2005 | Höhn et al. |
| 6,908,682 | B2 | 6/2005 | Mistele |
| 6,921,929 | B2 | 7/2005 | LeBoeuf et al. |
| 6,958,250 | B2 | 10/2005 | Yang |
| 7,064,355 | B2 | 6/2006 | Camras et al. |
| 7,157,839 | B2 | 1/2007 | Ouderkirk et al. |
| 7,192,795 | B2 | 3/2007 | Boardman et al. |
| 7,193,365 | B2 | 3/2007 | Ishizaka |
| 7,245,072 | B2 | 7/2007 | Ouderkirk et al. |
| 7,264,378 | B2 | 9/2007 | Loh |
| 7,276,562 | B2 | 10/2007 | Kashiwagi |
| 7,279,346 | B2 | 10/2007 | Andrews et al. |
| 7,304,425 | B2 | 12/2007 | Ouderkirk et al. |
| 7,314,770 | B2 | 1/2008 | Boardman et al. |
| 7,344,902 | B2 | 3/2008 | Basin et al. |
| 7,452,737 | B2 | 11/2008 | Basin et al. |
| 7,511,424 | B2 | 3/2009 | Sofue et al. |
| 7,517,728 | B2 | 4/2009 | Leung et al. |
| 7,527,871 | B2 | 5/2009 | Morita et al. |
| 7,531,847 | B2 | 5/2009 | Shitagaki et al. |
| 7,595,515 | B2 | 9/2009 | Thompson et al. |
| 2004/0116640 | A1 | 6/2004 | Miyoshi |
| 2004/0178509 | A1* | 9/2004 | Yoshino et al. ............... 257/780 |
| 2004/0227149 | A1 | 11/2004 | Ibbetson et al. |
| 2006/0035092 | A1 | 2/2006 | Shimizu et al. |
| 2006/0081864 | A1* | 4/2006 | Nakazawa ...................... 257/98 |
| 2006/0157875 | A1 | 7/2006 | Van Santen et al. |
| 2006/0186428 | A1 | 8/2006 | Tan et al. |
| 2006/0186429 | A1 | 8/2006 | Chew |
| 2006/0189013 | A1 | 8/2006 | Schardt et al. |
| 2006/0205237 | A1* | 9/2006 | Kodama et al. ............... 438/790 |
| 2007/0092636 | A1 | 4/2007 | Thompson et al. |
| 2007/0092736 | A1 | 4/2007 | Boardman et al. |
| 2007/0092737 | A1 | 4/2007 | Boardman et al. |
| 2007/0134425 | A1 | 6/2007 | Morita et al. |
| 2007/0269586 | A1 | 11/2007 | Leatherdale et al. |
| 2007/0273282 | A1* | 11/2007 | Radkov et al. ................ 313/512 |

FOREIGN PATENT DOCUMENTS

| | | |
|---|---|---|
| JP | 2002-232018 | 8/2002 |
| KR | 2004-0086871 | 8/2002 |
| WO | WO 95/25735 | 9/1995 |
| WO | WO 2006/013066 | 2/2006 |

\* cited by examiner

LIGHT EMITTING DEVICE WITH MULTILAYER SILICON-CONTAINING ENCAPSULANT

CROSS-REFERENCE TO RELATED APPLICATION

This application is a continuation of U.S. Ser. No. 11/741,808, filed Apr. 30, 2007, now U.S. Pat. No. 7,655,486 now allowed, the disclosure of which is incorporated by reference herein.

FIELD

This disclosure relates to a light emitting device, and more particularly, to a light emitting device having a light emitting diode (LED) and a multilayer silicon-containing encapsulant.

BACKGROUND

LED light emitting devices can be manufactured in a variety of configurations, many of which incorporate one or two conductive metal wires connecting a semiconductor or LED die to electrodes in the base of an LED package. The bonding points of the wires to the electrodes and/or the LED die are known to be failure points for LED light emitting devices, and care must be exercised in handling the devices in order to avoid damaging the wire bonds. LED die are typically encapsulated with a transparent organic resin, which serves to both increase the amount of light extracted from the die as well as to protect the die from physical damage.

In general, there is a need for transparent organic resins that can be used as encapsulants for LED light emitting devices. Resins having relatively rapid cure mechanisms are desirable in order to accelerate manufacturing times and reduce overall device cost.

SUMMARY

Disclosed herein is a method of making a light emitting device. In one aspect, the method comprises: providing a light emitting diode; and forming a multilayer encapsulant in contact with the light emitting diode, wherein forming the multilayer encapsulant comprises: contacting the light emitting diode with a first encapsulant comprising a silicone gel, silicone gum, silicone fluid, organosiloxane, polysiloxane, polyimide, polyphosphazene, or sol-gel composition; contacting the first encapsulant with a photopolymerizable composition comprising a silicon-containing resin and a metal-containing catalyst, the silicon-containing resin comprising silicon-bonded hydrogen and aliphatic unsaturation; and applying actinic radiation having a wavelength of 700 nm or less to initiate hydrosilylation within the silicon-containing resin thereby forming a second encapsulant.

In another aspect, the method comprises: providing a light emitting diode; and forming a multilayer encapsulant in contact with the light emitting diode, wherein forming the multilayer encapsulant comprises: contacting the light emitting diode with a first photopolymerizable composition comprising a first silicon-containing resin and a first metal-containing catalyst, the first silicon-containing resin comprising silicon-bonded hydrogen and aliphatic unsaturation; and contacting the first photopolymerizable composition with a second photopolymerizable composition comprising a second silicon-containing resin and a second metal-containing catalyst, the second silicon-containing resin comprising silicon-bonded hydrogen and aliphatic unsaturation; and applying actinic radiation having a wavelength of 700 nm or less to initiate hydrosilylation within the first and second silicon-containing resins thereby forming first and second encapsulants, respectively.

In yet another aspect, the method comprises: providing a light emitting diode; and forming a multilayer encapsulant in contact with the light emitting diode, wherein forming the multilayer encapsulant comprises: contacting the light emitting diode with a first photopolymerizable composition comprising a first silicon-containing resin and a first metal-containing catalyst, the first silicon-containing resin comprising silicon-bonded hydrogen and aliphatic unsaturation; and contacting the first photopolymerizable composition with a second photopolymerizable composition comprising a second silicon-containing resin and a second metal-containing catalyst, the second silicon-containing resin comprising silicon-bonded hydrogen and aliphatic unsaturation; and contacting the second photopolymerizable composition with a third photopolymerizable composition comprising a third silicon-containing resin and a third metal-containing catalyst, the third silicon-containing resin comprising silicon-bonded hydrogen and aliphatic unsaturation; and applying actinic radiation having a wavelength of 700 nm or less to initiate hydrosilylation within the first, second, and third silicon-containing resins thereby forming first, second, and third encapsulants, respectively.

The method disclosed herein provides an LED light emitting device with numerous advantages. With the appropriate selection of materials, the properties of the first and second encapsulants can be tuned individually to provide a device with improved photochemical and thermal stability, resistance to physical defects, extended lifetime, and increased optical efficiency.

These and other aspects of the invention will be apparent from the detailed description below. In no event, however, should the above summary be construed as a limitation on the claimed subject matter, which subject matter is defined solely by the attached claims, as may be amended during prosecution.

DETAILED DESCRIPTION

Figure 1:
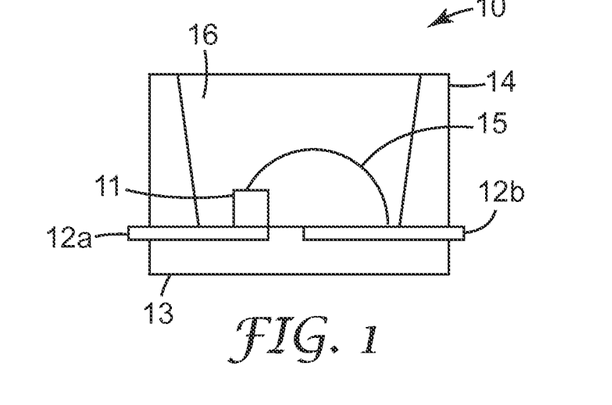
FIG. 1 is a schematic diagram of an LED light emitting device known in the art.

FIG. 1 shows LED light emitting device 10 in which an LED die is encapsulated with an encapsulant. LED die 11 is mounted on metallized contact 12a disposed on substrate 13 in reflecting cup 14. LED die 11 has one electrical contact on its lowermost surface and another on its uppermost surface, the latter of which is connected to separate metallized contact 12b by wire bond 15. A power source (not shown) can be coupled to the metallized contacts to energize the LED die. Encapsulant 16 encapsulates the LED die.

A known failure mode for LED light emitting devices such as the one shown in FIG. 1, is breakage of the wire bond as the device undergoes many cycles of heating and cooling, with temperatures in excess of 130° C. followed by cooling back to ambient temperature. Repeated thermal cycling can subject the wire bond to stress when an encapsulant having a high modulus and a high coefficient of thermal expansion is used, and this stress can ultimately lead to device failure. Epoxies are examples of such encapsulants. One solution to this problem is to use a low modulus, elastomeric, gel-like, or liquid-like silicon encapsulant, or even very high molecular weight liquids such as silicone gums encapsulating the chip and wire bond. These materials, however, suffer from other problems including a fragile surface prone to damage during assembly, shipping, or board population and increased dust pick-up on the surface of the encapsulant.

One way to provide a soft inner layer with a hard outer layer is to provide a soft gel silicone with a suitably shaped hard outer shell that can be formed separately using an injection molding process. However, this external shell adds cost and complexity to the packaging process, for example, by requiring at least one additional pick and place operation. Furthermore, most injection moldable plastics have refractive indices significantly higher than those of the most photostable silicone materials (the refractive index of polydimethylsiloxane is approximately 1.4). As a result, the package lifetime stability must be traded against optical efficiency.

Figure 2:
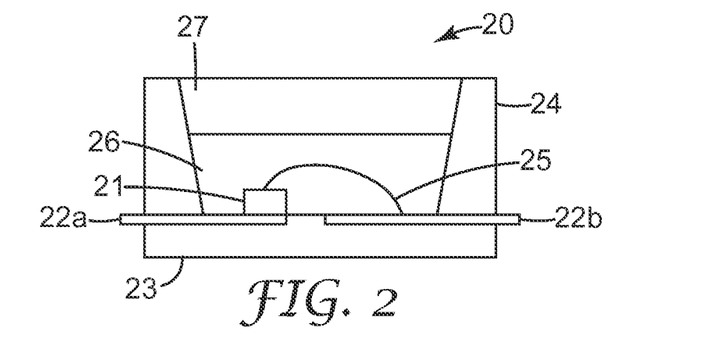
FIGS. 2 and 3 are schematic diagrams of exemplary LED light emitting devices as disclosed herein.

FIG. 2 shows exemplary LED light emitting device 20 which includes an LED die encapsulated with a multilayer encapsulant. LED die 21 is mounted on metallized contact 22a disposed on substrate 23 in reflecting cup 24. LED die 21 has one electrical contact on its lowermost surface and another on its uppermost surface, the latter of which is connected to separate metallized contact 22b by wire bond 25. A power source (not shown) can be coupled to the metallized contacts to energize the LED die. A multilayer encapsulant comprising first and second encapsulants, 26 and 27, respectively, encapsulates the LED die.

The multilayer encapsulant provides several advantages. The properties of the first and second encapsulants can be tuned individually with the appropriate selection of materials. For example, the first encapsulant can be designed to protect the second encapsulant from high heat and light generated by the LED die. (LED die temperature can reach over 125° C.) The first encapsulant can also be selected such that it is softer than the second encapsulant, or it can have lower modulus or viscosity relative to the second encapsulant. These properties can help reduce the amount of stress on the wire bond(s) during thermal cycling of the device such that damage to the wire bond(s) is minimized. The second encapsulant can be selected such that it provides a hard outer surface that resists scratching and other types of physical defects that might otherwise affect the optical characteristics of light emitted by the device. The second encapsulant can also be selected so that it alleviates dust pick up issues common to current commercial encapsulants. Another advantage is that the first and second encapsulants can also be designed to increase the optical efficiency of the device, for example, if the refractive index of the first encapsulant is greater than that of the second.

In one embodiment, the method comprises: providing a light emitting diode; and forming a multilayer encapsulant in contact with the light emitting diode, wherein forming the multilayer encapsulant comprises: contacting the light emitting diode with a first encapsulant comprising a silicone gel, silicone gum, silicone fluid, organosiloxane, polysiloxane, polyimide, polyphosphazene, or sol-gel composition; contacting the first encapsulant with a photopolymerizable composition comprising a silicon-containing resin and a metal-containing catalyst, the silicon-containing resin comprising silicon-bonded hydrogen and aliphatic unsaturation; and applying actinic radiation having a wavelength of 700 nm or less to initiate hydrosilylation within the silicon-containing resin thereby forming a second encapsulant.

Suitable materials for the first encapsulant include those that are thermally stable, photochemically stable, clear and colorless in nature. Herein, thermally stable refers to a material that does not chemically degrade upon prolonged exposure to heat, particularly with respect to the formation of colored or light absorbing degradation products. Herein, photochemically stable refers to a material that does not chemically degrade upon prolonged exposure to actinic radiation, particularly with respect to the formation of colored or light absorbing degradation products.

The first encapsulant may be a soft material, i.e., softer than the second encapsulant. Soft materials include silicone gel or a non-reactive or reactive liquid or gel material that is photo and thermally stable that exerts little to no stress on the wire bond. The first encapsulant may comprise an organosiloxane-containing liquid, gel, elastomer, or a non-elastic solid. Preferred liquid materials are non-functional silicone fluids and silicone gums, curing silicone fluids that build viscosity on irradiation, silicone gums made from low molecular weight fluids that cure and chain extend into gum like materials (i.e. no crosslinking) on irradiation with UV light, and curing silicone gels. As used herein, fluid refers to a material that flows readily as compared to a gum which does not. The first encapsulant layer may also comprise colorless soluble polyimides such as those described in U.S. Pat. No. 5,750,641, polyphosphazenes, polysiloxanes, and sol gel compositions. In one embodiment, the first encapsulant comprises a silicone gel, silicone gum, silicone fluid, organosiloxane, polysiloxane, polyimide, polyphosphazene, or sol-gel composition. For example, the first encapsulant may comprise an organosiloxane, and the organosiloxane comprises a trimethylsilyloxy-terminated polydimethylsiloxane.

The second encapsulant comprises a silicon-containing encapsulant which is advantageous because of its thermal and photochemical stability. Silicon-containing encapsulants are known in the art. These compositions typically comprise organosiloxanes that are cured either by acid-catalyzed condensation reactions between silanol groups bonded to the organosiloxane components or by metal-catalyzed hydrosilylation reactions between groups incorporating aliphatic unsaturation and silicon-bonded hydrogen which are bonded to the organosiloxane components. In the first instance, the curing reaction is relatively slow, sometimes requiring many hours to proceed to completion. In the second instance, desirable levels of cure normally require temperatures significantly in excess of room temperature. For example, US Patent Application Publication US 2004/0116640 A1 states that such compositions are " . . . preferably cured by heating at about 120 to 180° C. for about 30 to 180 minutes."

The second encapsulant is formed from a photopolymerizable composition as described in U.S. Pat. No. 7,192,795 B1. The photopolymerizable composition comprises organosiloxane compositions that are cured by metal-catalyzed hydrosilylation reactions between groups incorporating aliphatic unsaturation and silicon-bonded hydrogen, which are bonded to the organosiloxane components. However, the metal-containing catalysts used herein can be activated by actinic radiation. The advantages of using radiation-activated hydrosilylation to cure the compositions include (1) the ability to cure the encapsulating composition without subjecting the LED die, the substrate to which it is attached, or any other materials present in the package or system, to potentially harmful temperatures, (2) the ability to formulate one-part encapsulating compositions that display long working times (also known as bath life or shelf life), (3) the ability to cure the encapsulating formulation on demand at the discretion of the user, and (4) the ability to simplify the formulation process by avoiding the need for two-part formulations as is typically required for thermally curable hydrosilylation compositions.

The second encapsulant can be in the form of an elastomer or a non-elastic solid, and is thermally and photochemically stable. The photopolymerizable composition comprises a silicon-containing resin that can be cured by a rapid cure mechanism (e.g., seconds to less than 30 minutes) in order to accelerate manufacturing times and reduce overall cost.

The silicon-containing resin can include monomers, oligomers, polymers, or mixtures thereof. It includes silicon-bonded hydrogen and aliphatic unsaturation, which allows for hydrosilylation (i.e., the addition of a silicon-bonded hydrogen across a carbon-carbon double bond or triple bond). The silicon-bonded hydrogen and the aliphatic unsaturation may or may not be present in the same molecule. Furthermore, the aliphatic unsaturation may or may not be directly bonded to silicon.

Examples of suitable silicon-containing resins are disclosed, for example, in U.S. Pat. No. 6,376,569 (Oxman et al.), U.S. Pat. No. 4,916,169 (Boardman et al.), U.S. Pat. No. 6,046,250 (Boardman et al.), U.S. Pat. No. 5,145,886 (Oxman et al.), U.S. Pat. No. 6,150,546 (Butts), and in U.S. Pat. Appl. Nos. 2004/0116640 (Miyoshi). A preferred silicon-containing resin comprises an organosiloxane (i.e., silicones) which includes organopolysiloxanes. Such resins typically include at least two components, one having silicon-bonded hydrogen and one having aliphatic unsaturation. However, both silicon-bonded hydrogen and olefinic unsaturation may exist within the same molecule.

In one embodiment, the silicon-containing resin can include a silicone component having at least two sites of aliphatic unsaturation (e.g., alkenyl or alkynyl groups) bonded to silicon atoms in a molecule and an organohydrogensilane and/or organohydrogenpolysiloxane component having at least two hydrogen atoms bonded to silicon atoms in a molecule. Preferably, a silicon-containing resin includes both components, with the silicone containing aliphatic unsaturation as the base polymer (i.e., the major organosiloxane component in the composition.) Preferred silicon-containing resins are organopolysiloxanes. Such resins typically comprise at least two components, at least one of which contains aliphatic unsaturation and at least one of which contains silicon-bonded hydrogen. Such organopolysiloxanes are known in the art and are disclosed in such patents as U.S. Pat. No. 3,159,662 (Ashby), U.S. Pat. No. 3,220,972 (Lamoreauz), U.S. Pat. No. 3,410,886 (Joy), U.S. Pat. No. 4,609,574 (Keryk), U.S. Pat. No. 5,145,886 (Oxman, et. al), and U.S. Pat. No. 4,916,169 (Boardman et. al). Curable one component organopolysiloxane resins are possible if the single resin component contains both aliphatic unsaturation and silicon-bonded hydrogen.

Organopolysiloxanes that contain aliphatic unsaturation are preferably linear, cyclic, or branched organopolysiloxanes comprising units of the formula $R^1_a R^2_b SiO_{(4-a-b)/2}$ wherein: $R^1$ is a monovalent, straight-chained, branched or cyclic, unsubstituted or substituted hydrocarbon group that is free of aliphatic unsaturation and has from 1 to 18 carbon atoms; $R^2$ is a monovalent hydrocarbon group having aliphatic unsaturation and from 2 to 10 carbon atoms; a is 0, 1, 2, or 3; b is 0, 1, 2, or 3; and the sum a+b is 0, 1, 2, or 3; with the proviso that there is on average at least 1 $R^2$ present per molecule.

Organopolysiloxanes that contain aliphatic unsaturation preferably have an average viscosity of at least 5 mPa·s at 25° C.

Examples of suitable $R^1$ groups are alkyl groups such as methyl, ethyl, n-propyl, iso-propyl, n-butyl, iso-butyl, tert-butyl, n-pentyl, iso-pentyl, neo-pentyl, tert-pentyl, cyclopentyl, n-hexyl, cyclohexyl, n-octyl, 2,2,4-trimethylpentyl, n-decyl, n-dodecyl, and n-octadecyl; aromatic groups such as phenyl or naphthyl; alkaryl groups such as 4-tolyl; aralkyl groups such as benzyl, 1-phenylethyl, and 2-phenylethyl; and substituted alkyl groups such as 3,3,3-trifluoro-n-propyl, 1,1,2,2-tetrahydroperfluoro-n-hexyl, and 3-chloro-n-propyl. In one embodiment, at least 20 mole percent of the $R^1$ groups are aryl, aralkyl, alkaryl, or combinations thereof. In another embodiment, the $R^1$ groups are methyl, phenyl, or a combination thereof.

Examples of suitable $R^2$ groups are alkenyl groups such as vinyl, 5-hexenyl, 1-propenyl, allyl, 3-butenyl, 4-pentenyl, 7-octenyl, and 9-decenyl; and alkynyl groups such as ethynyl, propargyl and 1-propynyl. In the present invention, groups having aliphatic carbon-carbon multiple bonds include groups having cycloaliphatic carbon-carbon multiple bonds.

Organopolysiloxanes that contain silicon-bonded hydrogen are preferably linear, cyclic or branched organopolysiloxanes comprising units of the formula $R^1_a H_c SiO_{(4-a-c)/2}$ wherein: $R^1$ is as defined above; a is 0, 1, 2, or 2; and the sum of a+c is 0, 1, 2, or 3; with the proviso that there is on average at least 1 silicon-bonded hydrogen atom present per molecule. In one embodiment, at least 90 mole percent of the $R^1$ groups are methyl. In another embodiment, the $R^1$ groups are methyl, phenyl, or a combination thereof.

Organopolysiloxanes that contain silicon-bonded hydrogen preferably have an average viscosity of at least 5 mPa·s at 25° C.

Organopolysiloxanes that contain both aliphatic unsaturation and silicon-bonded hydrogen preferably comprise units of both formulae $R^1_a R^2_b SiO_{(4-a-b)/2}$ and $R^1_a H_c SiO_{(4-a-c)/2}$. In these formulae, $R^1$, $R^2$, a, b, and c are as defined above, with the proviso that there is an average of at least 1 group containing aliphatic unsaturation and 1 silicon-bonded hydrogen atom per molecule.

The molar ratio of silicon-bonded hydrogen atoms to aliphatic unsaturation in the silicon-containing resin (particularly the organopolysiloxane resin) may range from 0.5 to 10.0 mol/mol, preferably from 0.8 to 4.0 mol/mol, and more preferably from 1.0 to 3.0 mol/mol.

For some embodiments, organopolysiloxane resins described above wherein a significant fraction of the $R^1$ groups are phenyl or other aryl, aralkyl, or alkaryl are preferred, because the incorporation of these groups provides materials having higher refractive indices than materials wherein all of the $R^1$ radicals are, for example, methyl.

The disclosed method involves the use of actinic radiation having a wavelength of less than or equal to 700 nanometers (nm). Thus, the disclosed methods are particularly advantageous to the extent they avoid harmful temperatures. Preferably, the disclosed methods involve the application of actinic radiation at a temperature of less than 120° C., more preferably, at a temperature of less than 60° C., and still more preferably at a temperature of 25° C. or less.

Actinic radiation used in the disclosed methods includes light of a wide range of wavelengths less than or equal to 700 nm, including visible and UV light, but preferably, the actinic radiation has a wavelength of of 600 nm or less, and more preferably from 200 to 600 nm, and even more preferably, from 250 to 500 nm. Preferably, the actinic radiation has a wavelength of at least 200 nm, and more preferably at least 250 nm.

A sufficient amount of actinic radiation is applied to the silicon-containing resin for a time to form an at least partially cured encapsulant. A partially cured encapsulant means that at least 5 mole percent of the aliphatic unsaturation is consumed in a hydrosilylation reaction. Preferably, a sufficient amount of the actinic radiation is applied to the silicon-containing resin for a time to form a substantially cured encapsulant. A substantially cured encapsulant means that greater than 60 mole percent of the aliphatic unsaturation present in the reactant species prior to reaction has been consumed as a result of the light activated addition reaction of the silicon-bonded hydrogen with the aliphatic unsaturated species. Preferably, such curing occurs in less than 30 minutes, more preferably in less than 10 minutes, and even more preferably in less than 5 minutes. In certain embodiments, such curing can occur in seconds.

Examples of sources of actinic radiation include those of a very wide range. These include tungsten halogen lamps, xenon arc lamps, mercury arc lamps, incandescent lamps, fluorescent lamps, lasers, and external LED illuminators. In certain embodiments, the source of actinic radiation is the LED die, such that applying actinic radiation comprises activating the LED die.

The disclosed compositions also include a metal-containing catalyst which enables the cure of the encapulating material via radiation-activated hydrosilylation. These catalysts are known in the art and typically include complexes of precious metals such as platinum, rhodium, iridium, cobalt, nickel, and palladium. The precious metal-containing catalyst preferably contains platinum. Disclosed compositions can also include a cocatalyst.

A variety of such catalysts is disclosed, for example, in U.S. Pat. No. 6,376,569 (Oxman et al.), U.S. Pat. No. 4,916,169 (Boardman et al.), U.S. Pat. No. 6,046,250 (Boardman et al.), U.S. Pat. No. 5,145,886 (Oxman et al.), U.S. Pat. No. 6,150,546 (Butts), U.S. Pat. No. 4,530,879 (Drahnak), U.S. Pat. No. 4,510,094 (Drahnak) U.S. Pat. No. 5,496,961 (Dauth), U.S. Pat. No. 5,523,436 (Dauth), U.S. Pat. No. 4,670,531 (Eckberg), as well as International Publication No. WO 95/025735 (Mignani).

Certain preferred platinum-containing catalysts are selected from the group consisting of Pt(II) β-diketonate complexes (such as those disclosed in U.S. Pat. No. 5,145,886 (Oxman et al.), ($\eta^5$-cyclopentadienyl)tri(σ-aliphatic)platinum complexes (such as those disclosed in U.S. Pat. No. 4,916,169 (Boardman et al.) and U.S. Pat. No. 4,510,094 (Drahnak)), and $C_{7-20}$-aromatic substituted ($\eta^5$-cyclopentadienyl)tri(σ-aliphatic)platinum complexes (such as those disclosed in U.S. Pat. No. 6,150,546 (Butts).

Such catalysts are used in an amount effective to accelerate the hydrosilylation reaction. Such catalysts are preferably included in the encapsulating material in an amount of at least 1 part, and more preferably at least 5 parts, per one million parts of the encapsulating material composition. Such catalysts are preferably included in the encapsulating material in an amount of no greater than 1000 parts of metal, and more preferably no greater than 200 parts of metal, per one million parts of the encapsulating material composition.

In another embodiment, the method disclosed herein comprises: providing a light emitting diode; and forming a multilayer encapsulant in contact with the light emitting diode, wherein forming the multilayer encapsulant comprises: contacting the light emitting diode with a first photopolymerizable composition comprising a first silicon-containing resin and a first metal-containing catalyst, the first silicon-containing resin comprising silicon-bonded hydrogen and aliphatic unsaturation; and contacting the first photopolymerizable composition with a second photopolymerizable composition comprising a second silicon-containing resin and a second metal-containing catalyst, the second silicon-containing resin comprising silicon-bonded hydrogen and aliphatic unsaturation; and applying actinic radiation having a wavelength of 700 nm or less to initiate hydrosilylation within the first and second silicon-containing resins thereby forming first and second encapsulants, respectively. The first encapsulant may be softer than the second.

The first and second photopolymerizable compositions may be photopolymerizable compositions as described above. In this case, they can be dispensed into the LED package sequentially and then cured simultaneously to reduce the process time associated with dispensing and curing a first layer material and then dispensing and curing a second layer material. The photocuring silicones would also allow for improvements in process time for this stepwise curing mechanism as well due to the rapid cure times achievable with photocuring silicones as was described in U.S. Pat. No. 7,192,795 B1.

In general, the materials used in the first and second photopolymerizable compositions may be selected such that the first encapsulant is softer than the second. By softer it is meant that the first encapsulant is more easily deformed by an external mechanical force than the second encapsulant. For example, the first encapsulant may have a lower Young's modulus or lower Shore Hardness. A softer first encapsulant may be obtained by an appropriate selection of the first and second silicon-containing resins. For example, a softer first encapsulant may be obtained by having a lower crosslink density than the second. This may be achieved by decreasing the number of silicon-bonded hydrogens along the backbone of the first silicon-containing resin, and/or by increasing the molecular weight of the segments between crosslinks. A softer first encapsulant may also be obtained by the particular metal-containing catalyst used in each of the photopolymerizable compositions. For example, if the same metal-containing catalyst is used, then a softer first encapsulant may be obtained by including less of the catalyst in the first photopolymerizable composition. If the same silicon-containing resin is use, then a softer first encapsulant may be obtained by including a less reactive catalyst in the first photopolymerizable composition.

For the embodiments described herein, the materials used for the first and second encapsulants may be selected to obtain desired refractive indices. For example, the first and second encapsulants have substantially the same refractive index. For another example, the first encapsulant may have a refractive index greater than that of the second. This step down in refractive index from light emitting chip to the first encapsulant to the second encapsulant and finally to air, results in more efficient light extraction from the package due to minimization of light loss due Fresnel reflection and absorption. If the encapsulants have different refractive indices, it is possible for there to be a thin graded index layer at the interface resulting from interdiffusion of the high and low index materials. The level of interdiffusion will be a function of the chemical nature of the materials, the curing mechanism, and rate of cure.

Particularly useful constructions include (1) an LED with a first encapsulant in contact with the semiconductor die and wire bonds and a second encapsulant disposed on top of the first encapsulant, wherein the first encapsulant has a higher refractive index than the second encapsulant; (2) an LED with a first silicon-containing encapsulant in contact with the semiconductor die and wire bonds and a second encapsulant disposed on top of the first encapsulant, wherein the first encapsulant has a higher refractive index than the second encapsulant and the first encapsulant is a liquid, gel, gum or very soft elastomer; and (3) an LED with a first silicon-containing encapsulant in contact with the semiconductor die and wire bonds and a second encapsulant disposed on top of the first encapsulant, wherein the first encapsulant has a refractive index substantially the same as the second encapsulant and the first encapsulant is a liquid, gel, gum or very soft elastomer. Another embodiment is a two-layer, liquid/gel to solid, two-layer construction where the first encapsulant is a non-reactive or reactive liquid or gel material that is sealed with a reactive solid layer on top.

For UV light, silicon-containing resins having refractive indices of at least 1.34 are preferred. For some embodiments, silicon-containing resins having refractive indices of at least 1.50 are preferred.

In another embodiment, a third encapsulant may be used. In this case, the second encapsulant may have a refractive index greater than that of the third encapsulant. A particularly useful construction comprises: (4) an LED with a first silicon-containing encapsulant in contact with the semiconductor die and wire bonds and a second encapsulant disposed on top of the first encapsulant, wherein the first encapsulant has a higher refractive index than the second encapsulant and the first encapsulant is a liquid, gel, gum or very soft elastomer, and includes a third encapsulant disposed on the second encapsulant wherein the refractive index of the second is greater than that of the third encapsulant The first and/or second encapsulants can comprise one or more additives selected from the group consisting of nonabsorbing metal oxide particles, semiconductor particles, phosphors, sensitizers, antioxidants, pigments, photoinitiators, catalyst inhibitors, and combinations thereof. If used, such additives are used in amounts to produced the desired effect.

As described above, it may be desirable for the first encapsulant to have a refractive index greater than that of the second. This may be achieved by including high refractive index nanometer sized particles that may or may not be surface modified. If desired, the nanoparticles can be selected so that they do not introduce color or scattering to the encapsulant.

Nonabsorbing metal oxide and semiconductor particles that are substantially transparent over the emission bandwidth of the LED can be used. For example, a 1 mm thick disk of the nonabsorbing metal oxide and/or semiconductor particles mixed with encapsulant may absorb less than about 30% of the light incident on the disk. In other cases the mixture may absorb less than 10% of the light incident on the disk. Examples of nonabsorbing metal oxide and semiconductor particles include, but are not limited to, $Al_2O_3$, $ZrO_2$, $TiO_2$, $V_2O_5$, ZnO, $SnO_2$, ZnS, $SiO_2$, and mixtures thereof, as well as other sufficiently transparent non-oxide ceramic materials such as semiconductor materials including such materials as ZnS, CdS, and GaN. The particles can be surface treated to improve dispersibility in the encapsulant. Examples of such surface treatment chemistries include silanes, siloxanes, carboxylic acids, phosphonic acids, zirconates, titanates, and the like. Techniques for applying such surface treatment chemistries are known. Silica ($SiO_2$) has a relatively low refractive index but it may be useful in some applications, for example, as a thin surface treatment for particles made of higher refractive index materials, to allow for more facile surface treatment with organosilanes. In this regard, the particles can include species that have a core of one material on which is deposited a material of another type.

If used, the nonabsorbing metal oxide and semiconductor particles are preferably included in the encapsulating material in an amount of no greater than 85 wt-%, based on the total weight of the encapsulating material. Preferably, the nonabsorbing metal oxide and semiconductor particles are included in the encapsulating material in an amount of at least 10 wt-%, and more preferably in an amount of at least 45 wt-%, based on the total weight of the encapsulating material. Generally the particles can range in size from 1 nanometer to 1 micron, preferably from 10 nanometers to 300 nanometers, more preferably, from 10 nanometers to 100 nanometers. This particle size is an average particle size, wherein the particle size is the longest dimension of the particles, which is a diameter for spherical particles. It will be appreciated by those skilled in the art that the volume percent of metal oxide and/or semiconductor particles cannot exceed 74 percent by volume given a monomodal distribution of spherical particles.

Phosphors can optionally be included in the encapsulating material to adjust the color emitted from the LED. As described herein, a phosphor consists of a photoluminescent material. The fluorescent material could be inorganic particles, organic particles, or organic molecules or a combination thereof. Suitable inorganic particles include doped garnets (such as YAG:Ce and (Y,Gd)AG:Ce), aluminates (such as $Sr_2Al_{14}O_{25}$:Eu, and BAM:Eu), silicates (such as SrBaSiO:Eu), sulfides (such as ZnS:Ag, CaS:Eu, and $SrGa_2S_4$:Eu), oxy-sulfides, oxy-nitrides, phosphates, borates, and tungstates (such as $CaWO_4$). These materials may be in the form of conventional phosphor powders or nanoparticle phosphor powders. Another class of suitable inorganic particles is the so-called quantum dot phosphors made of semiconductor nanoparticles including Si, Ge, CdS, CdSe, CdTe, ZnS, ZnSe, ZnTe, PbS, PbSe, PbTe, InN, InP, InAs, AlN, AlP, AlAs, GaN, GaP, GaAs and combinations thereof. Generally, the surface of each quantum dot will be at least partially coated with an organic molecule to prevent agglomeration and increase compatibility with the binder. In some cases the semiconductor quantum dot may be made up of several layers of different materials in a core-shell construction. Suitable organic molecules include fluorescent dyes such as those listed in U.S. Pat. No. 6,600,175 (Baretz et al.). Preferred fluorescent materials are those that exhibit good durability and stable optical properties. The phosphor layer may consist of a blend of different types of phosphors in a single layer or a series of layers, each containing one or more types of phosphors. The inorganic phosphor particles in the phosphor layer may vary in size (e.g., diameter) and they may be segregated such that the average particle size is not uniform across the cross-section of the siloxane layer in which they are incorporated. If used, the phosphor particles are preferably included in the encapsulating material in an amount of no greater than 85 wt-%, and in an amount of at least 1 wt-%, based on the total weight of the encapsulating material. The amount of phosphor used will be adjusted according to the thickness of the siloxane layer containing the phosphor and the desired color of the emitted light.

Sensitizers can optionally be included in the encapsulating material to both increase the overall rate of the curing process (or hydrosilylation reaction) at a given wavelength of initiating radiation and/or shift the optimum effective wavelength of the initiating radiation to longer values. Useful sensitizers include, for example, polycyclic aromatic compounds and aromatic compounds containing a ketone chromaphore (such as those disclosed in U.S. Pat. No. 4,916,169 (Boardman et al.) and U.S. Pat. No. 6,376,569 (Oxman et al.)). Examples of useful sensitizers include, but are not limited to, 2-chlorothioxanthone, 9,10-dimethylanthracene, 9,10-dichloroanthracene, and 2-ethyl-9,10-dimethylanthracene. If used, such sensitizers are preferably included in the encapsulating material in an amount of no greater than 50,000 parts by weight, and more preferably no greater than 5000 parts by weight, per one million parts of the composition. If used, such sensitizers are preferably included in the encapsulating material in an amount of at least 50 parts by weight, and more preferably at least 100 parts by weight, per one million parts of the composition.

Photoinitiators can optionally be included in the encapsulating material to increase the overall rate of the curing process (or hydrosilylation reaction). Useful photoinitiators include, for example, monoketals of α-diketones or α-ketoaldehydes and acyloins and their corresponding ethers (such as those disclosed in U.S. Pat. No. 6,376,569 (Oxman et al.)). If used, such photoinitiators are preferably included in the encapsulating material in an amount of no greater than 50,000 parts by weight, and more preferably no greater than 5000 parts by weight, per one million parts of the composition. If used, such photoinitiators are preferably included in the encapsulating material in an amount of at least 50 parts by weight, and more preferably at least 100 parts by weight, per one million parts of the composition.

Catalyst inhibitors can optionally be included in the encapsulating material to further extend the usable shelf life of the composition. Catalyst inhibitors are known in the art and include such materials as acetylenic alcohols (for example, see U.S. Pat. No. 3,989,666 (Niemi) and U.S. Pat. No. 3,445,420 (Kookootsedes et al.)), unsaturated carboxylic esters (for example, see U.S. Pat. No. 4,504,645 (Melancon), U.S. Pat. No. 4,256,870 (Eckberg), U.S. Pat. No. 4,347,346 (Eckberg), and U.S. Pat. No. 4,774,111(Lo)) and certain olefinic siloxanes (for example, see U.S. Pat. No. 3,933,880 (Bergstrom), U.S. Pat. No. 3,989,666 (Niemi), and U.S. Pat. No. 3,989,667 (Lee et al.). If used, such catalyst inhibitors are preferably included in the encapsulating material in an amount not to exceed the amount of the metal-containing catalyst on a mole basis.

Figure 3:
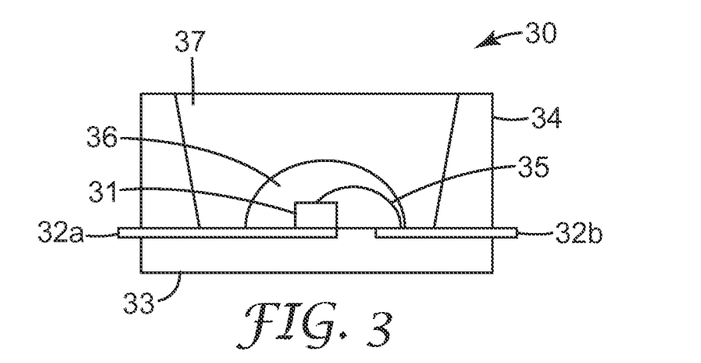

The light emission for the LED light emitting device can be modified by the shape and structure of the first encapsulant. FIG. 3 shows exemplary LED light emitting device 30 which includes an LED die encapsulated with a multilayer encapsulant, wherein the first encapsulant is shaped as a small lens over the die. LED die 31 is mounted on metallized contact 32a disposed on substrate 33 in reflecting cup 34. LED die 31 has one electrical contact on its lowermost surface and another on its uppermost surface, the latter of which is connected to separate metallized contact 32b by wire bond 35. A power source (not shown) can be coupled to the metallized contacts to energize the LED die. A multilayer encapsulant comprising first and second encapsulants, 36 and 37, respectively, encapsulates the LED die.

In the embodiment shown in FIG. 3, the small lens over the die can be used to narrow the light distribution emitted from the package. Shaping of the inner encapsulant layer is possible by controlling the rheological and wetting properties of the resin and/or controlling the surface energy of the package material by treatment with organic monolayers. First encapsulant 36 can have a relatively high refractive index.

The multilayer encapsulant described herein is used for light emitting devices that include an LED. LED in this regard refers to a diode that emits light, whether visible, ultraviolet, or infrared. It includes encapsulated semiconductor devices marketed as "LEDs", whether of the conventional or superradiant variety. Vertical cavity surface emitting laser diodes are another form of LED. An "LED die" is an LED in its most basic form, i.e., in the form of an individual component or chip made by semiconductor wafer processing procedures. The component or chip can include electrical contacts suitable for application of power to energize the device. The individual layers and other functional elements of the component or chip are typically formed on the wafer scale, the finished wafer finally being diced into individual piece parts to yield a multiplicity of LED dies.

The silicon-containing materials described herein are useful with a wide variety of LEDs, including monochrome and phosphor-LEDs (in which blue or UV light is converted to another color via a fluorescent phosphor). They are also useful for encapsulating LEDs packaged in a variety of configurations, including but not limited to LEDs surface mounted in ceramic or polymeric packages, which may or may not have a reflecting cup, LEDs mounted on circuit boards, and LEDs mounted on plastic electronic substrates.

LED emission light can be any light that an LED source can emit and can range from the UV to the infrared portions of the electromagnetic spectrum depending on the composition and structure of the semiconductor layers. Where the source of the actinic radiation is the LED itself, LED emission is preferably in the range from 350-500 nm. The silicon-containing materials described herein are particularly useful in surface mount and side mount LED packages where the encapsulant is cured in a reflector cup. They are also particularly useful with LED designs containing a top wire bond (as opposed to flip-chip configurations). Additionally, the silicon containing materials can be useful for surface mount LEDs where there is no reflector cup and can be useful for encapsulating arrays of surface mounted LEDs attached to a variety of substrates.

The silicon-containing materials described herein are resistant to thermal and photodegradation (resistant to yellowing) and thus are particularly useful for white light sources (i.e., white light emitting devices). White light sources that utilize LEDs in their construction can have two basic configurations. In one, referred to herein as direct emissive LEDs, white light is generated by direct emission of different colored LEDs. Examples include a combination of a red LED, a green LED, and a blue LED, and a combination of a blue LED and a yellow LED. In the other basic configuration, referred to herein as LED-excited phosphor-based light sources (PLEDs), a single LED generates light in a narrow range of wavelengths, which impinges upon and excites a phosphor material to produce visible light. The phosphor can comprise a mixture or combination of distinct phosphor materials, and the light emitted by the phosphor can include a plurality of narrow emission lines distributed over the visible wavelength range such that the emitted light appears substantially white to the unaided human eye.

An example of a PLED is a blue LED illuminating a phosphor that converts blue to both red and green wavelengths. A portion of the blue excitation light is not absorbed by the phosphor, and the residual blue excitation light is combined with the red and green light emitted by the phosphor. Another example of a PLED is an ultraviolet (UV) LED illuminating a phosphor that absorbs and converts UV light to red, green, and blue light. Organopolysiloxanes where the $R^1$ groups are small and have minimal UV absorption, for example methyl, are preferred for UV light emitting diodes. It will be apparent to one skilled in the art that competitive absorption of the actinic radiation by the phosphor will decrease absorption by the photoinitiators slowing or even preventing cure if the system is not carefully constructed.

The LED may have an optical element encapsulated in it, as described in US 2007/0269586 A1 (Leatherdale et al.) and US 2006/0189013 A1 (Schardt et al.), the disclosures of which are incorporated herein by reference for all that they contain.

EXAMPLES

Mounting Blue LED Die in a Ceramic Package

Into a Kyocera package (Kyocera America, Inc., Part No. KD-LA2707-A) was bonded a Cree XT die (Cree Inc., Part No. C460XT290-0119-A) using a water based halide flux (Superior No. 30, Superior Flux & Mfg. Co.). The LED device was completed by wire bonding (Kulicke and Soffa Industries, Inc. 4524 Digital Series Manual Wire Bonder) the Cree XT die using 1 mil gold wire. Prior to encapsulation, each device was tested using a OL 770 Spectroradiometer (Optronics Laboratories, Inc.) with a constant current of 20 mA. The peak emission wavelength of the LED was ~460 nm.

Formulations

The following formulations were used:
F-1: 10.00 g of Dow Corning 6-3495 intermediate +1.00 g of Dow Corning SYLGARD 184 Curing Agent +100 µL of a solution of 33 mg of $(MeCp)PtMe_3$ in 1.00 mL of toluene, prepared in an amber vial.
F-2: 10.00 g of Dow Corning 6-3495 intermediate +0.25 g of Dow Corning SYLGARD 184 Curing Agent +100 µL of a solution of 33 mg of $(MeCp)PtMe_3$ in 1.00 mL of toluene, prepared in an amber vial.
F-3: 10.00 g of Dow Corning 6-3495 intermediate +0.10 g of Dow Corning SYLGARD 184 Curing Agent +100 µL of a solution of 33 mg of $(MeCp)PtMe_3$ in 1.00 mL of toluene, prepared in an amber vial.
F-4: Aldrich 37,840-2 trimethylsilyloxy-terminated polydimethylsiloxane having a viscosity of approximately 10,000 cps.

Example 1

In order to demonstrate the concept of an encapsulant with a soft inner layer and hard outer layer, samples were first evaluated for cure in approximately 1 cm diameter vial caps. Different combinations of the formulations from above were placed into the vial caps in the order described in Table 1, and the samples were irradiated for 10 minutes under UVP Blak-Ray Lamp Model XX-15 fitted with two 16 inch Philips TUV 15W/G15 T8 bulbs emitting primarily at 254 nm. The resultant plugs of cured organosiloxane were removed from the vial caps and evaluated for cure and surface tack on both upper and lower surfaces. Observations are described in Table 1.

Control

Into the ceramic package with LED die was placed approximately 2 mg of F-1. The uncured encapsulant was irradiated for 10 minutes under UVP Blak-Ray Lamp Model XX-15 fitted with two 16 inch Philips TUV 15W/G15 T8 bulbs emitting primarily at 254 nm. The cured encapsulant was elastomeric and cured as determined by probing with the tip of a tweezer. The efficiency of the LED was measured using an OL 770 spectroradiometer and increased from 11.3% before encapsulation to 13.8% after encapsulation.

TABLE 1

| Ex. | Procedure | Observation After Curing |
|---|---|---|
| 1a | 6 drops of F-1 | cured and tack free on both upper and lower surfaces |
| 1b | 6 drops of F-2 | cured but tacky on both upper and lower surfaces |
| 1c | 6 drops of F-3 | cured liquid material of slightly higher viscosity than F-3, such that it was stringy when probed with a spatula |
| 1d | 3 drops of F-2, then 3 drops of F-1 | cured and tack free on upper surface, cured but tacky on lower surface |
| 1e | 3 drops of F-3, then 3 drops of F-1 | cured and tack free on upper surface, uncured liquid layer of slightly higher viscosity than F-3 on lower surface |
| 1f | 3 drops of F-4, then 3 drops of F-1 | cured and tack free on upper surface, uncured liquid layer on lower surface |

Example 2

Into the ceramic package with LED die was placed a small drop of F-2 over the die and wire bond, followed by F-1 to the top of the cup. The sample was irradiated for 10 minutes under UVP Blak-Ray Lamp Model XX-15 fitted with two 16 inch Philips TUV 15W/G15 T8 bulbs emitting primarily at 254 nm. The outer layer of the cured encapsulant was a hard elastomer and was cured as determined by probing with the tip of a tweezer. The efficiency of the LED was measured using an OL 770 spectroradiometer and increased from 11.8% before encapsulation to 16.0% after encapsulation.

Example 3

Into the ceramic package with LED die was placed a small drop of F-3 over the die and wire bond, followed by F-1 to the top of the cup. The sample was irradiated for 10 minutes under UVP Blak-Ray Lamp Model XX-15 fitted with two 16 inch Philips TUV 15W/G15 T8 bulbs emitting primarily at 254 nm. The outer layer of the cured encapsulant was a hard elastomer and was cured as determined by probing with the tip of a tweezer. The efficiency of the LED was measured using an OL 770 spectroradiometer and increased from 11.5% before encapsulation to 15.3% after encapsulation.

Example 4

Into the ceramic package with LED die was placed a small drop of F-4 over the die and wire bond, followed by F-1 to the top of the cup. The sample was irradiated for 10 minutes under UVP Blak-Ray Lamp Model XX-15 fitted with two 16 inch Philips TUV 15W/G15 T8 bulbs emitting primarily at 254 nm. The outer layer of the cured encapsulant was a hard elastomer and was cured as determined by probing with the tip of a tweezer. The efficiency of the LED was measured using an OL 770 spectroradiometer and increased from 11.3% before encapsulation to 14.5% after encapsulation.

Example 5

Into the ceramic package with LED die was placed a small piece of General Electric SE-30 silicone gum over the die and wire bond. The gum was allowed several hours to flow and level in the bottom of the package over the die and wire bond, followed by adding F-1 to the top of the cup. The LED package with uncured 2-layer encapsulant was irradiated for 10 minutes under UVP Blak-Ray Lamp Model XX-15 fitted with two 16 inch Philips TUV 15W/G15 T8 bulbs emitting primarily at 254 nm. The outer layer of the cured encapsulant was a hard elastomer and was cured as determined by probing with the tip of a tweezer. The efficiency of the LED was measured using an OL 770 spectroradiometer and increased from 10.9% before encapsulation to 13.7% after encapsulation.

Example 6

A first mixture of 10.00 g of the vinyl siloxane base polymer H$_2$C=CH—SiMe$_2$O—(SiMePhO)$_{20}$—SiMe$_2$—CH=CH$_2$ (olefin meq wt=1.455 g) and 1.64 g of the siloxane crosslinking agent HMe$_2$SiO—(SiMeHO)$_5$—(SiMePhO)$_5$—SiMe$_2$H (Si—H meq wt=0.159 g), and a second mixture of 10.00 g of the vinyl siloxane base polymer H$_2$C=CH—SiMe$_2$—(SiMe$_2$O)$_{100}$—SiMe$_2$—CH=CH$_2$ (olefin meq wt=3.801 g) and 0.56 g of the siloxane crosslinking agent HMe$_2$SiO—(SiMeHO)$_{20}$—(SiMe$_2$O)$_{20}$—SiMe$_2$H (Si—H meq wt=0.142 g) were prepared in two 35 mL amber bottles. A catalyst stock solution was prepared by dissolving 15.6 mg of CpPtMe$_3$ in 1.00 mL of CH$_2$Cl$_2$, and 115 µL and 105 µL aliquots of this solution were added, respectively, to each of the two siloxane polymer mixtures. A vertical refractive index gradient was observed: The refractive index of the first formulation was 1.50 and that of the second formulation was 1.40, with each mixture equivalent to a C=C/Si—H functionality ratio of 1.5 and contains approximately 100 ppm of Pt. Into a Blue LED package (Stanley) was placed first approximately 1 mg of the first formulation followed by approximately 1 mg of the second formulation. The LED package was immediately illuminated for 1 minute under a UV lamp at 365 nm. Probing the surface of the encapsulant with the tip of a spatula confirmed that the material was fully cured and elastomeric. The light output of the two-layer encapsulant was increased relative to the LED package encapsulated with a single encapsulant of either the higher of lower refractive index silicone.

Example 7

A first mixture of 10.00 g of the vinyl silsesquioxane base polymer (H$_2$C=CH—SiO$_{3/2}$)$_2$-(PhSiO$_{3/2}$)$_{18}$(olefin meq wt=1.242 g) and 1.92 g of the siloxane crosslinking agent HMe$_2$SiO—(SiMeHO)$_5$—(SiMePhO)$_5$—SiMe$_2$H (Si—H meq wt =0.159 g) was prepared in a 35 mL amber vial. A second mixture of 10.00 g of the vinyl siloxane base polymer H$_2$C=CH—SiMe$_2$O—(SiMePhO)$_{20}$—SiMe$_2$—CH=CH$_2$ (olefin meq wt=1.455 g) and 1.64 g of the siloxane crosslinking agent HMe$_2$SiO—(SiMeHO)$_5$—(SiMePhO)$_5$—SiMe$_2$H (Si—H meq wt=0.159 g) and a third mixture of 10.00 g of the vinyl siloxane base polymer H$_2$C=CH—SiMe$_2$O—(SiMe$_2$O)$_{100}$—SiMe$_2$—CH=CH$_2$ (olefin meq wt=3.801 g) and 0.56 g of the siloxane crosslinking agent HMe$_2$SiO—(SiMeHO)$_{20}$—(SiMe$_2$O)$_{20}$-SiMe$_2$H (Si—H meq wt=0.142 g) were prepared in two 35 mL amber bottles. A catalyst stock solution was prepared by dissolving 15.6 mg of CpPtMe$_3$ in 1.00 mL of CH$_2$Cl$_2$, and 120 µL, 115 µL, and 105 µL aliquots of this solution were added, respectively, to each of the three siloxane polymer mixtures. A vertical refractive index gradient was observed: The refractive index of the first formulation was 1.55, the second 1.50, and that of the third formulation was 1.40. Each mixture was equivalent to a C=C/Si—H functionality ratio of 1.5, and contains approximately 100 ppm of Pt. Into a Blue LED package (Stanley) was placed first approximately 1, mg of the first formulation, followed by approximately 1, mg of the second formulation followed by approximately 1, mg of the third formulation. The LED was illuminated for 1, minute under a UV lamp at 365, nm. Probing the surface of the encapsulant with the tip of a spatula confirms that the material was fully cured and elastomeric. The light output of the three-layer encapsulant was increased relative to the LED package encapsulated with a single silicone formulation.

Various modifications and alterations to the invention will become apparent to those skilled in the art without departing from the scope and spirit of the invention. It should be understood that the invention is not intended to be unduly limited by the illustrative embodiments and examples set forth herein, and that such examples and embodiments are presented by way of example only with the scope of the invention intended to be limited only by the claims as set forth herein.

What is claimed is:

1. A light emitting device comprising:
a light emitting diode; and
a multilayer encapsulant in contact with the light emitting diode, wherein the multilayer encapsulant comprises:
a first encapsulant in contact with the light emitting diode and encapsulating the light emitting diode, the first encapsulant comprising a silicone gel, silicone gum, silicone fluid, organosiloxane, polysiloxane, polyimide, polyphosphazene, or sol-gel composition; and
a photopolymerizable composition in contact with the first encapsulant and comprising a silicon-containing resin and a metal-containing catalyst, the silicon-containing resin comprising silicon-bonded hydrogen and aliphatic unsaturation;
wherein the first encapsulant has a refractive index greater than that of the photopolymerizable composition.

2. The light emitting device of claim 1, wherein the first encapsulant comprises an organosiloxane, and the organosilozane comprises a trimethylsilyloxy-terminated polydimenthysiloxane.

3. The light emitting device of claim 1, wherein the silicon-bonded hydrogen and the aliphatic unsaturation are present in the same molecule.

4. The light emitting device of claim 1, wherein the silicon-bonded hydrogen and the aliphatic unsaturation are present in different molecules.

5. The light emitting device of claim 1, wherein the photopolymerizable composition comprises organosiloxane.

6. The light emitting device of claim 1, wherein the photopolymerizable composition comprises organosiloxane comprising units of the formula:

wherein:
R$^1$ is a monovalent, straight-chained branched or cyclic, unsubstituted or substituted, hydrocarbon group that is free of aliphatic unsaturation and has from 1 to 18 carbon atoms;
R$^2$ is a monovalent hydrocarbon group having aliphatic unsaturation and from 2 to 10 carbon atoms;
a is 0, 1, 2, or 3;
b is 0, 1, 2, or 3; and
the sum a+b is 0, 1, 2, or 3;
with the proviso that there is on average at least one R$^2$ present per molecule.

7. The light emitting device of claim 6, wherein at least 20 mole percent of the R$^1$ groups are aryl, aralkyl, alkaryl, or combinations thereof.

8. The light emitting device of claim 1, wherein the photopolymerizable composition comprises an organosiloxane comprising units of the formula:

wherein:
R$^1$ is a monovalent, straight-chained branched or cyclic, unsubstituted or substituted, hydrocarbon group that is free of aliphatic unstaturation and has from 1 to 18 carbon atoms;
a is 0, 1, 2, or 3;
c is 0, 1, or 2; and
the sum a+c is 0, 1, 2, or 3;
with the proviso that there is on average at least one silicon-bonded hydrogen present per molecule.

9. The light emitting device of claim 8, wherein at least 90 mole percent of the R$^1$ groups are methyl.

10. The light emitting device of claim 1, wherein the silicon-bonded hydrogen and the aliphatic unsaturation are present in a molar ratio of from 1.5 to 10.0.

11. The light emitting device of claim 1, wherein the metal-containing catalyst is selected from the group consisting of Pt(II) β-diketonate complexes, ($\eta^5$-cyclopentadienyl)tri(σ-aliphatic)platinum complexes, and C$_{7-20}$-aromatic substituted ($\eta^5$-cyclopentadienyl)tri(σ-aliphatic)platinum complexes.

12. The light emitting device of claim 1, wherein the photopolymerizable material comprises one or more additives selected from the group consisting of nonabsorbing metal oxide particles, semiconductor particles, phosphors, sensitizers, antioxidants, pigments, photoinitiators, catalyst inhibitors, and combinations thereof.

13. The light emitting device of claim 1, further comprising:
a wire bond connected to the light emitting diode;
wherein the first encapsulant encapsulates both the light emitting diode and the wire bond.

* * * * *